(12) United States Patent
Wu et al.

(10) Patent No.: US 11,277,936 B2
(45) Date of Patent: Mar. 15, 2022

(54) HEAT DISSIPATOR FOR CHARGING CONNECTOR, HEAT DISSIPATION DEVICE, AND VEHICLE

(71) Applicant: BYD COMPANY LIMITED, Shenzhen (CN)

(72) Inventors: Xingguo Wu, Shenzhen (CN); Hongjun Wang, Shenzhen (CN); Zhen Li, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 91 days.

(21) Appl. No.: 16/651,184

(22) PCT Filed: Sep. 29, 2018

(86) PCT No.: PCT/CN2018/108831
§ 371 (c)(1),
(2) Date: Mar. 26, 2020

(87) PCT Pub. No.: WO2019/062987
PCT Pub. Date: Apr. 4, 2019

(65) Prior Publication Data
US 2020/0275582 A1    Aug. 27, 2020

(30) Foreign Application Priority Data
Sep. 30, 2017    (CN) .......................... 201710940656.5

(51) Int. Cl.
*H05K 7/20*    (2006.01)
*B60L 53/16*    (2019.01)
*B60L 53/302*   (2019.01)

(52) U.S. Cl.
CPC .......... *H05K 7/20218* (2013.01); *B60L 53/16* (2019.02); *B60L 53/302* (2019.02);
(Continued)

(58) Field of Classification Search
CPC ........... H05K 7/20218; H05K 7/20136; H05K 7/20927; H05K 7/2039; B60L 53/302; B60L 53/16
(Continued)

(56) References Cited

U.S. PATENT DOCUMENTS 10,377,264 B2 *   8/2019  Lopez et al. .......... B60L 53/302
2009/0256523 A1  10/2009  Taguchi
(Continued)

FOREIGN PATENT DOCUMENTS

CN    102458908 A    5/2012
CN    202907394 U    4/2013
(Continued)

OTHER PUBLICATIONS

The World Intellectual Property Organization (WIPO) International Search Report for PCT/CN2018/108831 dated Dec. 28, 2018 5 Pages.

*Primary Examiner* — Sun J Lin
(74) *Attorney, Agent, or Firm* — Anova Law Group, PLLC

(57) ABSTRACT

This application discloses a heat dissipator for a charging connector, a heat dissipation device and a vehicle. The heat dissipator comprises a body formed to have a cooling chamber and an internally circumferentially defined receiving hole, wherein the receiving hole is configured to accommodate the charging connector.

16 Claims, 17 Drawing Sheets

(52) U.S. Cl.
CPC ....... *H05K 7/2039* (2013.01); *H05K 7/20136* (2013.01); *H05K 7/20927* (2013.01)

(58) Field of Classification Search
USPC ........................................................ 320/109
See application file for complete search history.

(56) References Cited

U.S. PATENT DOCUMENTS

| | | |
|---|---|---|
| 2013/0267115 A1 | 10/2013 | Mark |
| 2015/0217654 A1 | 8/2015 | Ferguson et al. |
| 2016/0221458 A1 | 8/2016 | Lopez et al. |
| 2016/0339786 A1 | 11/2016 | Dickinson et al. |
| 2017/0125993 A1 | 5/2017 | Krammer et al. |
| 2017/0129344 A1 | 5/2017 | Islinger et al. |

FOREIGN PATENT DOCUMENTS

| | | |
|---|---|---|
| CN | 204407960 U | 6/2015 |
| CN | 105835709 A | 8/2016 |
| CN | 205652077 U | 10/2016 |
| CN | 205666380 U | 10/2016 |
| CN | 106104949 A | 11/2016 |
| CN | 106347166 A | 1/2017 |
| CN | 206212550 U | 5/2017 |
| CN | 107054120 A | 8/2017 |
| CN | 107082030 A | 8/2017 |
| CN | 107107774 A | 8/2017 |
| JP | 2000115915 A | 4/2000 |
| JP | 2013055851 A | 3/2013 |
| TW | 201725965 A | 7/2017 |
| TW | 201726466 A | 8/2017 |

\* cited by examiner

HEAT DISSIPATOR FOR CHARGING CONNECTOR, HEAT DISSIPATION DEVICE, AND VEHICLE

REFERENCE TO RELATED APPLICATIONS

This application is a national phase entry under 35 U.S.C. § 371 of International Application No. PCT/CN2018/108831, filed on Sep. 29, 2018, which claims priority to and benefits of Chinese Patent Application Serial No. 201710940656.5, filed by BYD Company Ltd. on Sep. 30, 2017, and entitled "Heat dissipator for charging connector, heat dissipation device, and vehicle", content of all of which is incorporated herein by reference in its entirety.

FIELD

This application relates to the field of charging technologies of vehicles and, in particular, to a heat dissipator for a charging connector, a heat dissipation device having the heat dissipator, and a vehicle having the heat dissipation device.

BACKGROUND

At present, due to the energy and environmental issues, new energy vehicles are promoted to grow explosively, and the number of new energy vehicles is also increased constantly. Compared with traditional fuel vehicles, new energy vehicles have great advantages in energy conservation and environmental protection. However, the long charging time of electric vehicles in new energy vehicles is a long-standing criticism.

At present, the method of increasing the charging power to shorten the charging time is generally adopted. The accompanying problems are as follows. Due to the excessive current, the connecting terminal at the charging socket generates lots of heat, which causes the charging terminal to burn out or charge failure, so that the entire vehicle cannot be charged normally, and the charging safety cannot be effectively guaranteed.

In addition, although certain methods are also actively used by some manufacturers to reduce the temperature at the connecting terminal, for example, by arranging a cooling device at a charging wire harness. However, the cooling effect is undesirable and the arrangement is complicated.

SUMMARY

The present disclosure aims to solve one of the technical problems existing in related art at least to some extent. To this end, this application provides a heat dissipator for a charging connector, which can facilitate the effective heat dissipation of the charging connector.

The present disclosure further provides a heat dissipation device for a vehicle.

The present disclosure further provides a vehicle.

The heat dissipator for a charging connector according to the present disclosure comprises a body, in which a cooling chamber is formed in the body and a receiving hole is defined at an inner circumference, where the receiving hole is configured to accommodate the charging connector.

The heat dissipator according to the present disclosure cools the charging connector by liquid cooling, by configuring the cooling chamber. In this way, the working temperature of the charging connector is well controlled, to effectively avoid overheating of the connecting terminal of the charging connector, thus ensuring the charging safety of vehicles. In addition, the heat dissipator thus configured has simple structure and low cost.

The heat dissipation device for a vehicle according to the present disclosure includes a heat dissipation body. The heat dissipation body includes a board; cooling channels provided on the board; the heat dissipator fixed on the board, where the cooling chamber is in communication with the cooling channel; and a charging connector accommodated in the receiving hole.

The vehicle according to the present disclosure includes the heat dissipation device, and a cooling system, where the cooling channel and the cooling chamber communicate with the cooling system respectively.

Figure 1:
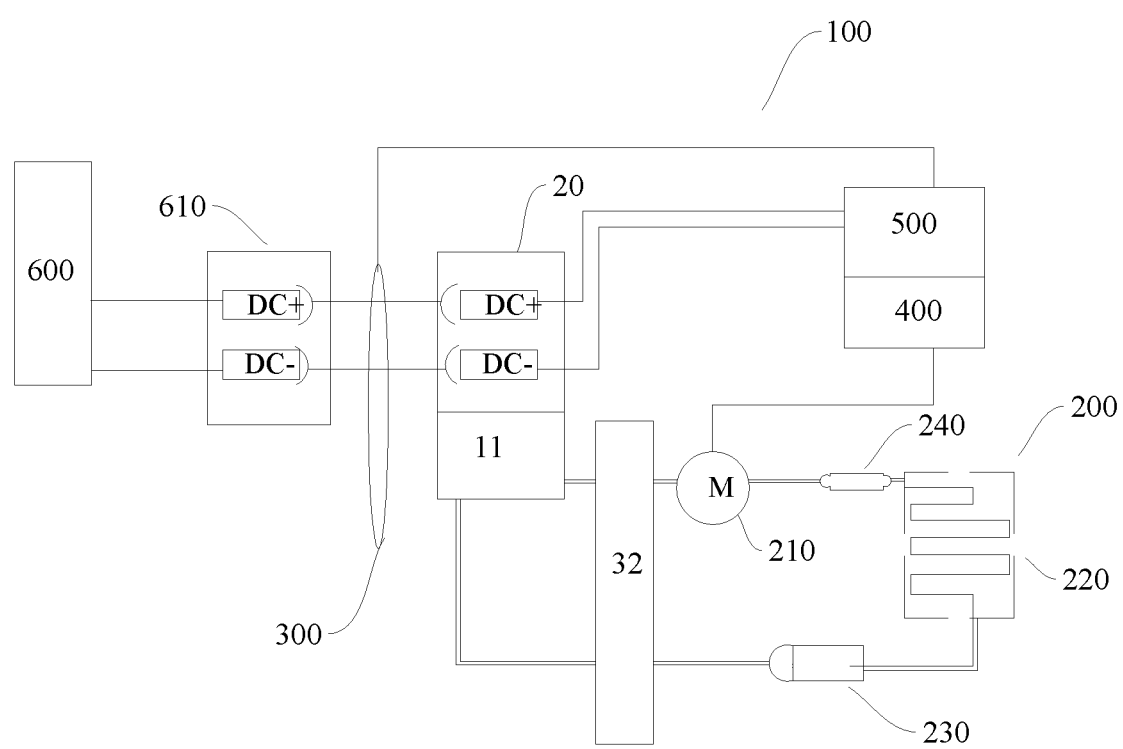
FIG. 1 is a schematic diagram of docking a charging socket in a heat dissipation device with a charging gun according to an embodiment of the present disclosure.

NUMERALS OF ELEMENTS heat dissipation device 100; heat dissipator 10; body 1; liquid inlet 1a; liquid outlet 1b; cooling chamber 11; receiving hole 12; air vent 13; clamping slot 14; long slot 14a; short slot 14b; air guiding wall 15; rear wall 16; terminal hole 17; first side wall 101, second side wall 102, connection portion 103, first connection portion 103a, second connection portion 103b, receiving hole 3; first heat sinks 4; terminal sheaths 5; separator 6; air blower 7; charging connector 20; connecting terminal 21; heat dissipation body 30; board 31; common inlet 31a; common outlet 31b; second heat sink 32; cooling system 200; pump 210; heat exchanger 220; liquid storage tank 230; filter 240; plug-in detection member 300; electric control module 400; power distribution module 500; charging post 600; charging gun 610; vehicle 1000

DETAILED DESCRIPTION

Embodiments of the present disclosure are described in detail below, and examples of the embodiments are shown in the accompanying drawings. The embodiments described below with reference to the drawings are exemplary, and are intended to explain the present disclosure and should not be construed as limiting the present disclosure.

A heat dissipation device 100 for a vehicle according to an embodiment of the present disclosure will be described in detail below with reference to the drawings.

As shown in FIGS. 1 to 16, the heat dissipation device 100 for a vehicle according to an embodiment of the present disclosure comprises a heat dissipation body 30, a heat dissipator 10 for a charging connector 20 and the charging connector 20. The heat dissipation body 30 includes a board 31 on which the heat dissipator 10 is fixed. The heat dissipator 10 is provided with a receiving hole 12 in which the charging connector 20 is accommodated. It should be noted that the receiving hole 12 may only serve for accommodation, and of course, it can be configured for installation and fixation, for example, some mounting structures are provided on the inner circumference.

The heat dissipator 10 can be used to mount the charging connector 20, and the heat dissipator 10 can be further used to cool the charging connector 20, and transfer the heat generated by the charging connector 20 to the board 31 and external environment, thereby further reducing the temperature of the charging connector 20.

The charging connector 20 may be a charging socket, and the charging connector 20 may include a connecting terminal 21. The heat dissipation device 100 thus configured can effectively reduce the temperature of the connecting terminal 21, thereby avoiding the problem of overheated connecting terminal 21. As such, the working reliability of the heat dissipation device 100 is improved, and the charging safety of vehicles is ensured. The connecting terminal 21 can include a positive connecting terminal and a negative connecting terminal for current transport. Such a connecting terminal 21 is adapted to a DC charging port.

Similarly, charging connecting terminals adapted to an AC charging port are also used in pairs, and multiple may be present, which can be implemented with the same principle as above.

The heat dissipator 10 for the charging connector 20 according to an embodiment of the present disclosure is described in detail with reference to the accompanying drawings.

As shown in FIGS. 5-8, the heat dissipator 10 according to a first embodiment of the present disclosure includes a body 1. Further, the heat dissipator 10 can also include other components, for example, a plurality of first heat sinks 4 and an air blower 7. A cooling chamber 11 is formed in the body 1, and the cooling chamber 11 can be filled with a cooling medium. The cooling medium may be cooling water or other coolants or a cooling gas. A receiving hole 12 is defined at an inner circumference of the body 1, and the receiving hole 12 is configured to accommodate the charging connector 20. That is to say, a portion of the charging connector 20 can be accommodated in the body 1, and the cooling chamber 11 is configured on the body 1, so that the charging connector 20 can be effectively cooled down by the cooling medium in the cooling chamber 11 by effectively taking away the heat of the charging connector 20. In this way, the working temperature of the charging connector 20 is well reduced, to avoid overheating of the connecting terminal of the charging connector 20, thus ensuring the charging safety of vehicles.

As shown in FIGS. 5-8, the plurality of heat sinks 4 is distributed on an outer surface of the body 1. The plurality of heat sinks 4 can effectively increase the heat dissipation area of the body 1, which further facilitates the heat dissipation of the charging connector 20, and contributes to the reduction in the temperature of the connecting terminal. Specifically, the plurality of heat sinks 4 is distributed on an external circumferential wall of the body 1.

Figure 5:
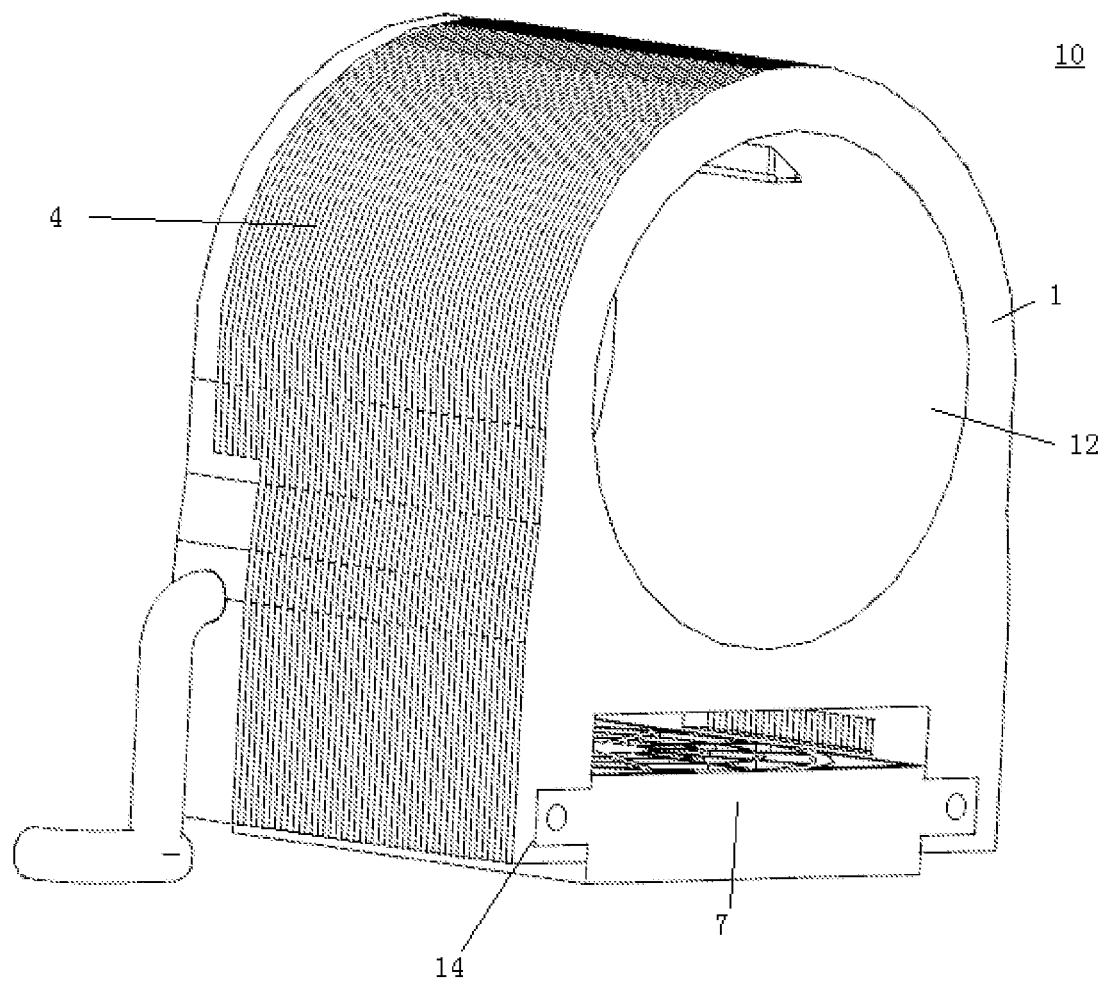
FIG. 5 is a schematic diagram of a heat dissipator.

As shown in FIG. 5, the air blower 7 is mounted on the body 1. It can be understood that the air blower 7 can blow air to the body 1 and the charging connector 20, and the heat of the body 1 is taken away when the air travels over the body 1, thereby speeding up the heat dissipation of the charging connector 20 and improving the heat dissipation performance of the heat dissipator 10.

The heat dissipator 10 according to the embodiment of the present disclosure cools the charging connector 20 by liquid cooling, natural cooling and air cooling in combination, by configuring the cooling chamber 11, the first heat sinks 4, and the air blower 7. In this way, the working temperature of the charging connector 20 is well controlled, to effectively avoid overheating of the connecting terminal of the charging connector 20, thus ensuring the charging safety of vehicles. In addition, the heat dissipator 10 thus configured has simple structure and low cost.

Figure 6:
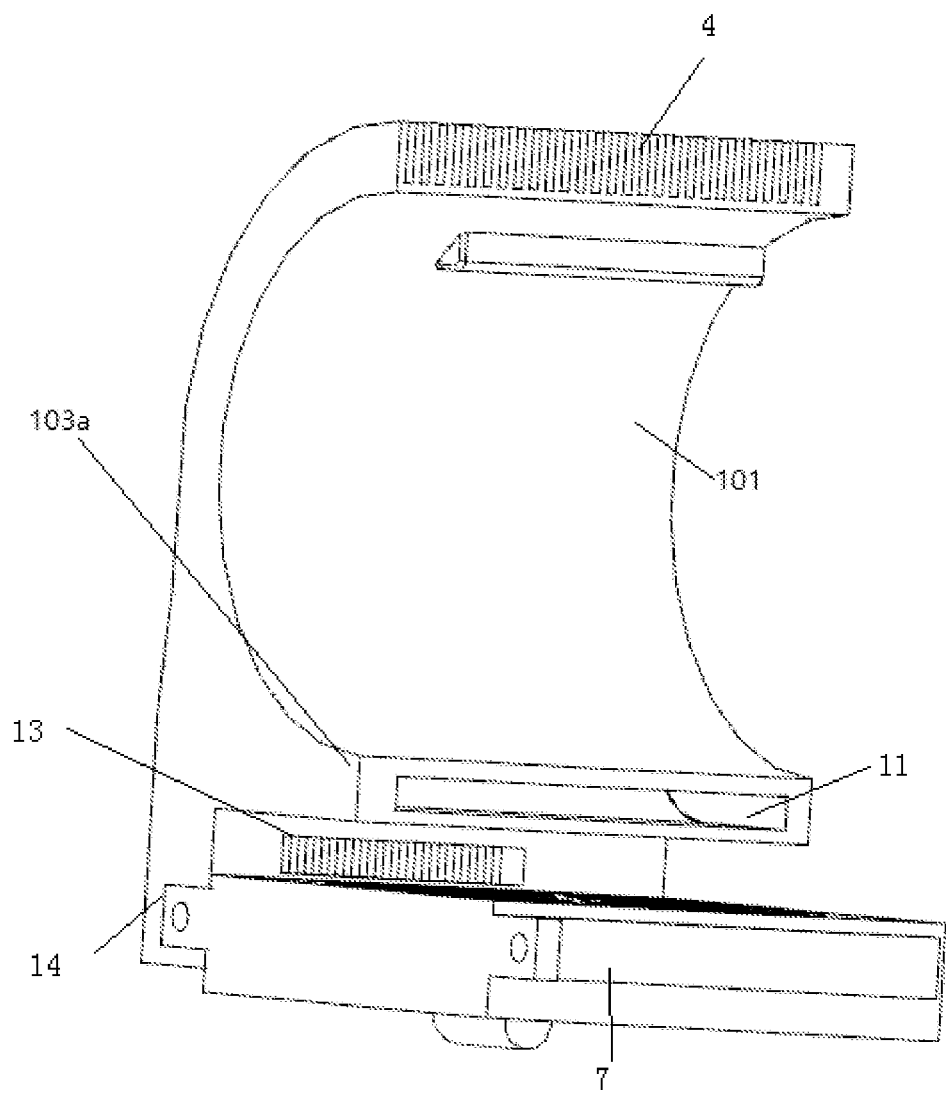
FIG. 6 is a sectional diagram of a heat dissipator.
Figure 8:
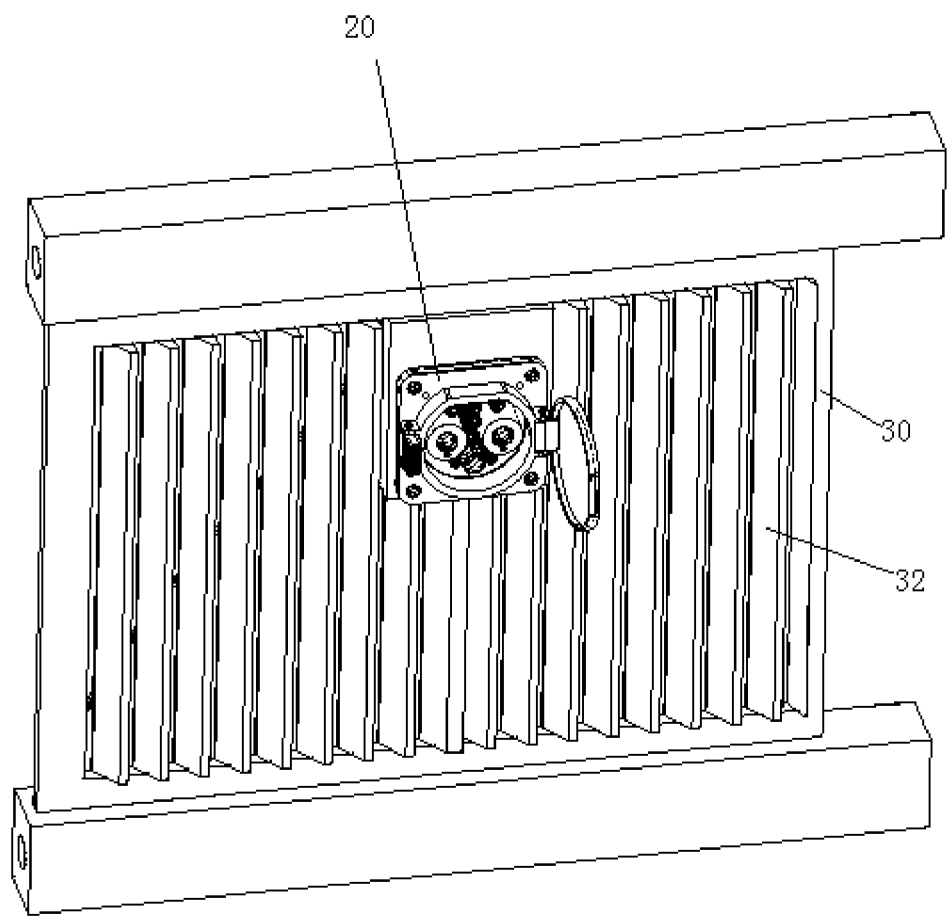
FIG. 8 is a schematic diagram of a heat dissipation device according to another embodiment of the present disclosure.
Figure 9:
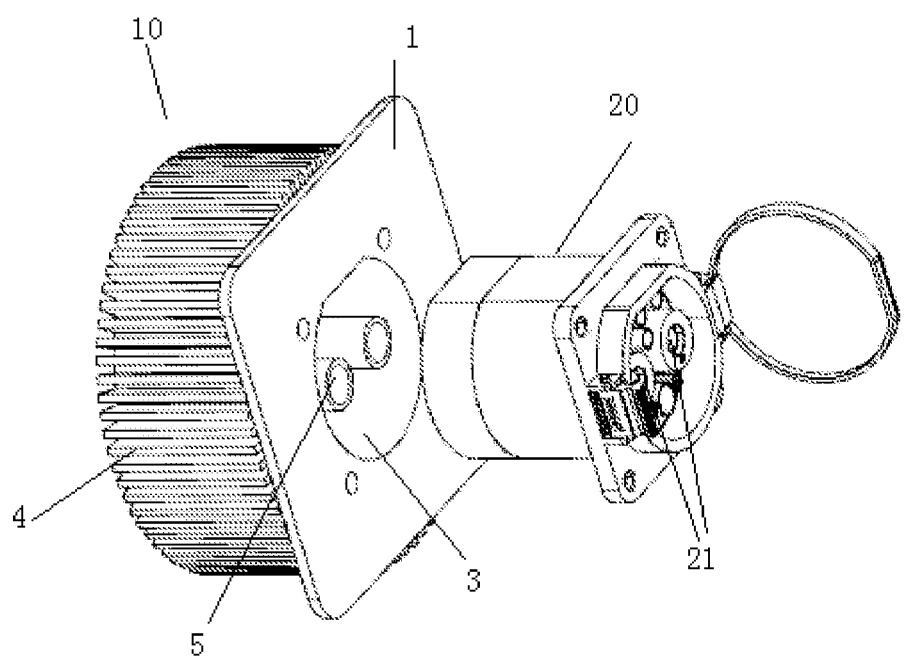
FIG. 9 is a schematic diagram of a charging connector and a heat dissipator according to an embodiment of the present disclosure.

According to an embodiment of the present disclosure, as shown in FIGS. 6 and 8, the cooling chamber 11 is arranged at a bottom of the body 1, and the cooling chamber 11 and the plurality of heat sinks 4 are spaced apart from each other in the radial direction of the body 1. That is to say, the cooling chamber 11 and the plurality of heat sinks 4 will not interfere with each other on the body 1. Therefore, the cooling chamber 11 thus configured can effectively cool the charging connector 20 on the one hand, and is beneficial to the reasonable arrangement of the body 1 on the other hand. The arrangement reserves enough design space for the first heat sinks 4, so that the two can be easily combined for better heat dissipation.

According to an embodiment of the present disclosure, the air blower 7 is mounted below the cooling chamber 11, and an inlet and an outlet of the cooling chamber 11 are provided on two sides of the body 1. The air blower 7 thus configured can also take away the heat of the body 1, and further reduce the temperature of the cooling chamber 11 at least to a certain extent, so that the working temperature of the charging connector 20 is reduced.

According to an embodiment of the present disclosure, as shown in FIG. 6, an air vent 13 is provided on the body 1, through which the air from the air blower 7 flows to the plurality of first heat sinks 4. As a result, the air from the air blower 7 can be supplied to the plurality of heat sinks 4 via the air vent 13, so that the air can effectively take away the heat on the first heat sinks 4. This facilitates the full heat dissipation by the first heat sinks 4, thereby effectively reducing the working temperature of the charging connector 20 and ensuring the charging safety of the vehicle. Specifically, the air vent 13 is provided on the external circumferential wall of the body 1, and runs through the external circumferential wall of the body 1 to communicate with the air duct formed by the plurality of heat sinks 4.

Figure 7:
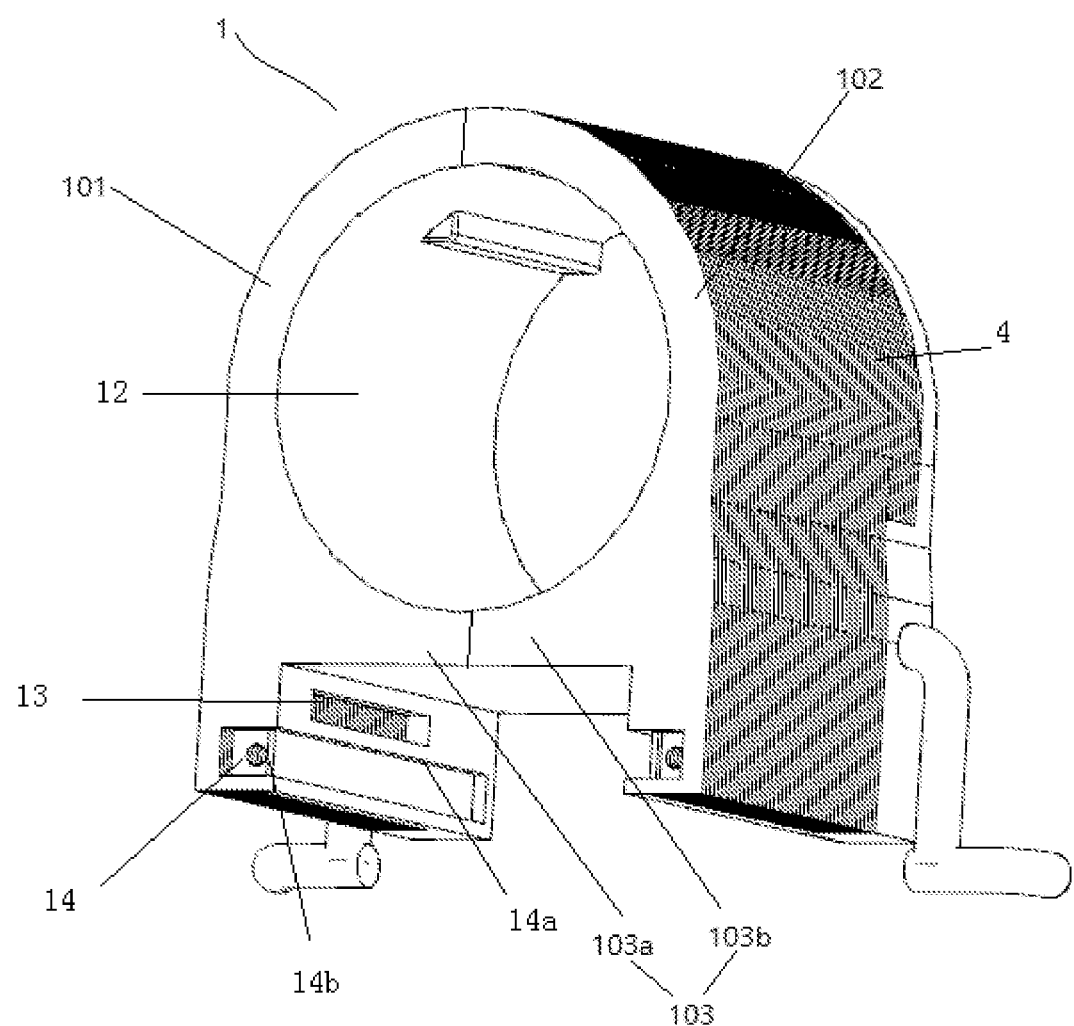
FIG. 7 is a sectional diagram of a body.

As shown in FIGS. 5-7, the plurality of first heat sinks 4 extends along the circumference of the body 1, and the plurality of heat sinks 4 is spaced apart from each other in the axial direction of the body 1. This facilitates the air from the air blower 7 to flow between two first heat sinks 4, thereby ensuring the contact area between the air and the first heat sinks 4, and ensuring the effective heat dissipation by the first heat sinks 4.

According to an embodiment of the present disclosure, the cooling chamber 11 has a cold-air side wall facing the air blowing direction of the air blower 7. The cold-air side wall is spaced from the air blower 7, and the air vent 13 is located between the cold-air side wall and the air blower 7. As a result, the air from the air blower 7 can be directly sent to the cooling chamber 11, which can effectively reduce the temperature of the cooling water in the cooling chamber 11; and the air can flow out through the air vent 13, thus promoting the air circulation.

As shown in FIGS. 5 and 7, the body 1 has an inverted U-shape and includes a first side wall 101 and a second side wall 102 provided on two sides respectively. The first side wall 101 and the second side wall 102 are attached to each other. A connection portion 103 is provided between the first side wall 101 and the second side wall 102. The distance from the connection portion 103 to the bottom end of the first side wall 101 is the same as the distance from the connection portion 103 to the bottom end of the second side wall 102. The connection portion 103 connects the first side wall 101 and the second side wall 102, and the connection portion 103, together with at least a portion of the first side wall 101 and at least a portion of the second side wall 102, encloses the receiving hole 12. Further, the connection portion 103 includes a first connection portion 103a and a second connection portion 103b, where the first connection portion 103a may be integrally formed with the first side wall 101, and the second connection portion 103b may be integrally formed with the second side wall 102. After the first side wall 101 is mated with the second side wall 102, the first side wall 101, the second side wall 102, the second connection portion 103b and the first connection portion 103a enclose the receiving hole 12. As such, the receiving hole 12 is convenient in configuration and the body 1 has a simple structure.

As shown in FIGS. 5 and 7, the outer surface of the body 1 is of an inverted complete U shape. On the outer surface of the body 1, the first heat sinks 4 extend along the outer circumference of the body 1 and are configured to surround the circumference of the outer surface of the body 1. Some of the plurality of heat sinks 4 extend from the bottom end of the first side wall 101 of the body 1 to the bottom end of the second side wall 102 of the body 1, so that the first heat sinks 4 have the same shape as that of the body 1, that is, inverted U-shape. The others of the plurality of heat sinks 4 may have an initial and a terminal end that are not flush with the bottom end of the first side wall 101 and the bottom end of the second side wall 102, that is, the heat sinks 4 have a shape different from the shape of the body 1. The first heat sinks 4 are of an inverted semi-U shape, to avoid the inlet and outlet on the cooling chamber 11.

The plurality of heat sinks 4 makes full use of the outer surface area of the body 1, and reserves enough space for the inlet and outlet of the cooling chamber 11, so that the body 1 has a reasonably configured structure and a good heat dissipation effect.

According to an embodiment of the present disclosure, as shown in FIG. 7, the plurality of heat sinks 4 extends on the body 1 to the bottom ends of both side walls (the first side wall 101 or second side wall 102), and is then curved and extends to the bottom surfaces of the bottom ends. In other words, the plurality of heat sinks 4 can also extend on the bottom surface of the bottom end, which can further increase the heat dissipation area and reduce the manufacturing difficulty.

As shown in FIG. 5, the air blower 7 is provided at the opposite bottom ends of both side walls. In this way, the position of the air blower 7 is reasonable. The air blower 7 makes reasonable use of the space of the body 1 and can supply air to the cooling chamber 11 reasonably, such that the temperature of the charging connector 20 is effectively reduced.

As shown in FIGS. 6 and 7, the bottom ends of the two side walls are respectively provided with a clamping slot 14, and the lateral ends of the air blower 7 are clamped in the clamping slots 14. The configuration of the clamping slot 14 can facilitate the installation of the air blower 7 at least to a certain extent, thus reducing the installation difficulty of the air blower 7. The air blower 7 may be a fan, since the fan has a simple structure and low cost.

According to an embodiment of the present disclosure, as shown in FIG. 7, the clamping slot 14 is L-shaped, and the clamping slot 14 includes a long slot 14a and a short slot 14b. The long slot 14a extends in an axial direction of the body 1, and the short slot 14b extends laterally at the bottom end of the side wall. The configuration of the long slot 14a and the short slot 14b can facilitate the installation and fixation of the edges of the air blower 7 in two directions, thereby further improving the installation reliability of the air blower 7, and allowing the air blower 7 to be more reasonably located below the cooling chamber 11.

The length of the long slot 14a is less than the axial length of the side wall, and the length of the short slot 14b is less than the thickness of the side wall. Therefore, the structural strength on both sides of the body 1 is ensured, the impact of the arrangement of the long slot 14a and the short slot 14b on the body 1 is reduced, and the installation reliability of the air blower 7 is improved.

As shown in FIGS. 9-16, the heat dissipator 10 according to a second embodiment of the present disclosure includes a body 1 and a plurality of heat sinks 4. A cooling chamber 11 is formed in the body 1. A receiving hole 3 is defined at an inner circumference of the body 1, and the receiving hole 3 is configured to accommodate the charging connector 20. That is to say, the charging connector 20 is mounted in the receiving hole 3. The configuration of the receiving hole 3 can ensure the installation reliability of the charging connector 20 on the one hand, and ensure that the body 1 is in full contact with the charging connector 20 on the other hand, which is beneficial to the sufficient heat exchange between the cooling chamber 11 and the charging connector 20.

A plurality of connecting terminals 21 are provided in the charging connector 20, for example, there are two connecting terminals 21. The connecting terminal 21 can include a positive connecting terminal and a negative connecting terminal for current transport. Such a connecting terminal 21 is adapted to a DC charging port.

Similarly, charging connecting terminals adapted to an AC charging port are also used in pairs, and multiple may be present, which can be implemented with the same principle as above.

As such, the cooling chamber 11 can effectively reduce the temperature of the connecting terminal 21, and avoid the problem of overheated connecting terminal 21, thereby ensuring the charging safety of vehicles. The cooling chamber can be filled with a cooling medium, and the cooling medium can be a coolant.

As shown in FIGS. 9-16, the plurality of heat sinks 4 is distributed on an outer circumference of the body 1. The first heat sinks 4 cooperate with the cooling chamber 11 to well take away the heat of the charging connector 20 and effectively reduce the temperature of the connecting terminal 21.

Figure 10:
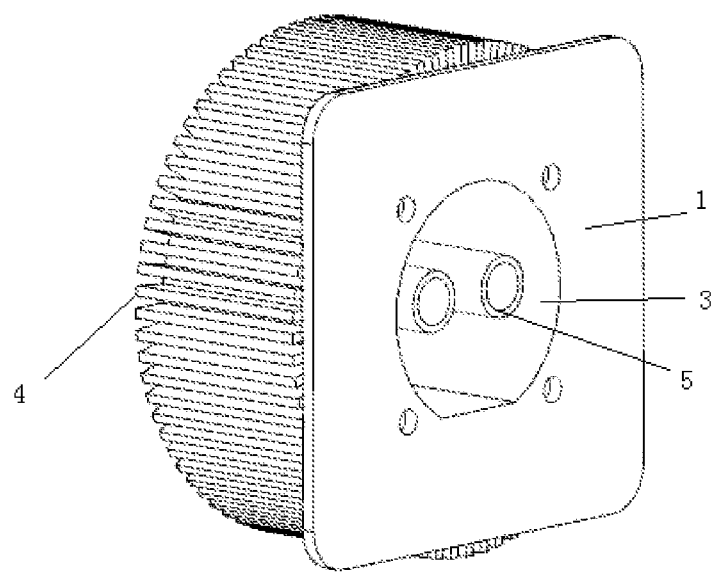
FIGS. 10-12 are schematic diagrams of a heat dissipator according to another embodiment of the present disclosure.
Figure 11:
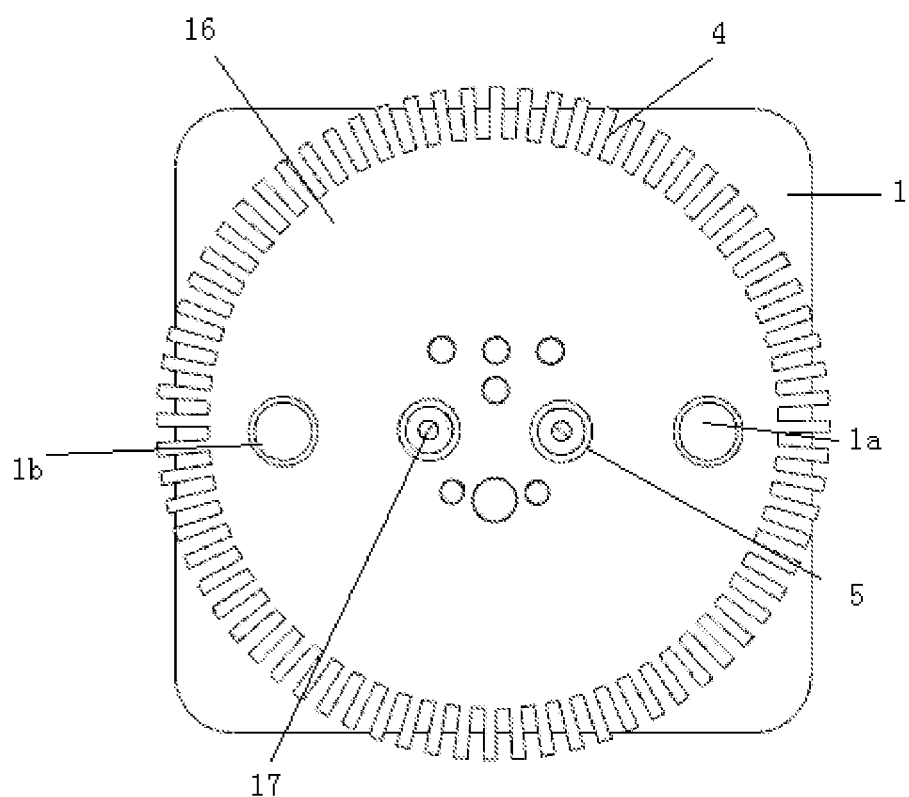
Figure 12:
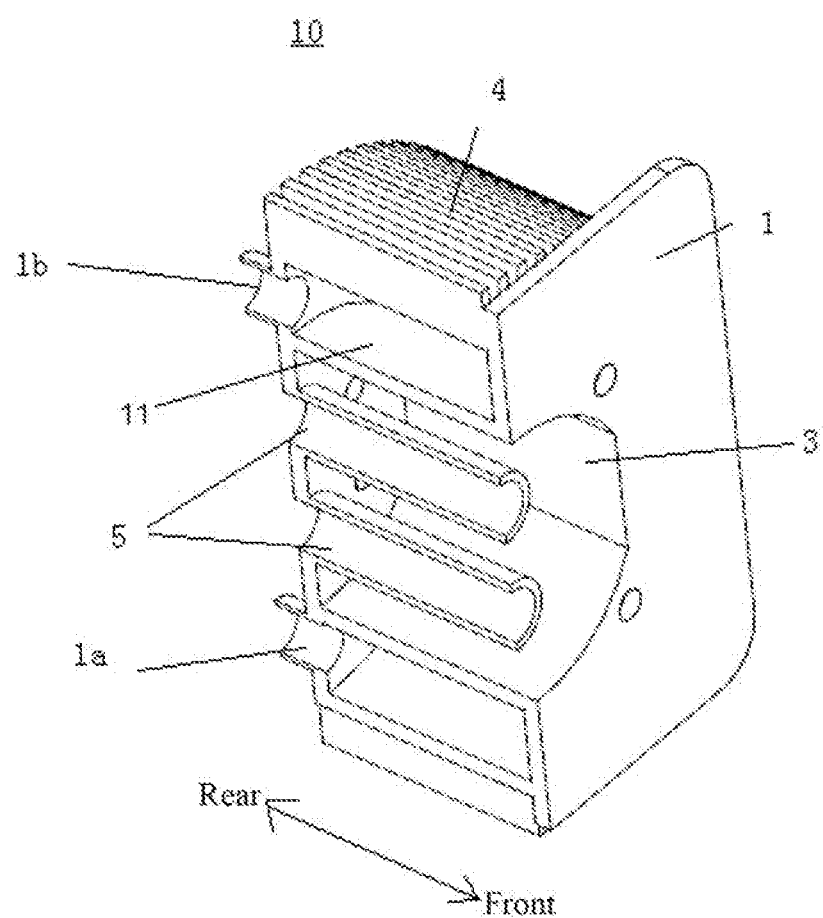

Of course, the heat dissipator 10 may further include other components. For example, as shown in FIGS. 10 to 12, the heat dissipator 10 may further include a plurality of terminal sheaths 5 that is fixed on the body 1 and located in the receiving hole 3, so that the terminal sheath 5 can fit with the connecting terminal 21 conveniently. The number of the terminal sheaths 5 may correspond to the number of the plurality of connecting terminals 21, and the terminal sheaths 5 may be sleeved on the corresponding connecting terminals 21.

The connecting terminal 21 can also transfer heat to the body 1 through the terminal sheath 5, so that the cooling chamber 11 and the first heat sinks 4 can better reduce the temperature of the connecting terminal 21, and the terminal sheath 5 can protect the connecting terminal 21 at least to some extent.

The heat dissipator 10 according to the embodiment of the present disclosure can cool the connecting terminal 21 by configuring the cooling chamber 11 and the first heat sinks 4, to avoid the problem of overheated connecting terminal 21 and ensure the charging safety of vehicles.

As shown in FIG. 11, the body 1 may include a rear wall 16, the terminal sheaths 5 extend forward from the rear wall 16 in the axial direction, and terminal holes 17 are formed in the rear wall 16. When a vehicle is charged, the connecting terminal 21 can be inserted into the terminal hole 17 so that the connecting terminal 21 can be easily fitted with the terminal sheaths 5.

As shown in FIGS. 13-15 and FIG. 1, a liquid inlet 1a and a liquid outlet 1b are formed at the bottom of the body 1, where the liquid inlet 1a and the liquid outlet 1b are spaced apart. Therefore, the liquid inlet 1a and the liquid outlet 1b are reasonably arranged, which allows convenient charge and discharge of liquids and makes the structure of the body 1 simple and the cooling chamber 11 arranged reasonably.

The liquid outlet 1b is provided with a pressure valve (not shown), and when the pressure in the cooling chamber 11 reaches a predetermined value, the pressure valve opens. Therefore, by arranging the pressure valve, the amount of the cooling medium in the cooling chamber 11 can be controlled, to ensure that sufficient cooling medium is present in the cooling chamber 11 when the charging connector 20 is docked with a charging gun 610 of a charging post 600, thereby ensuring the effect of the body 1 in reducing the temperature of the connecting terminal 21.

Of course, the liquid inlet 1a and the liquid outlet 1b may also have other arrangements. For example, the liquid inlet 1a and the liquid outlet 1b are formed on the body 1, such that the liquid inlet 1a is located directly above the liquid outlet 1b, or the liquid inlet 1a is located directly below the liquid outlet 1b. The liquid inlet 1a and liquid outlet 1b thus arranged can ensure that the cooling medium is effectively circulated in the cooling chamber 11, so that the cooling chamber 11 can better reduce the temperature of the charging connector 20, and avoid the problem of overheated connecting terminal 21.

According to an embodiment of the present disclosure, the liquid inlet 1a is located at the lowermost end of the body 1, and the liquid outlet 1b is located at the uppermost end of the body 1. Therefore, the cooling medium can flow out of the liquid outlet 1b only after the cooling chamber 11 is filled, whereby the cooling chamber 11 is well ensured to have sufficient cooling medium therein, thus further ensuring the effect of the heat dissipator 10 in reducing the temperature of the connecting terminal 21.

Figure 16:
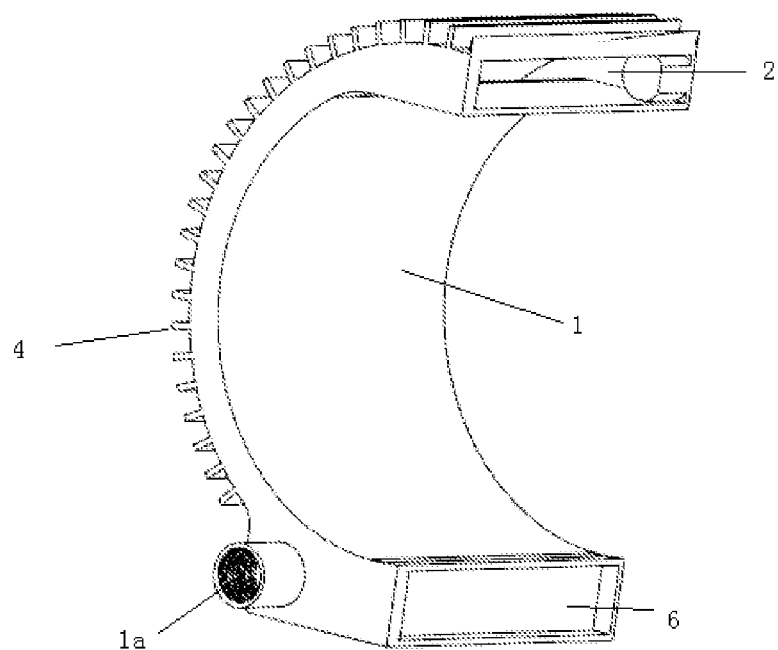

As shown in FIG. 16, a separator 6 may be provided between the liquid inlet 1a and the liquid outlet 1b. The separator 6 is used to ensure the circulation of the cooling medium in the cooling chamber 11, such that the heat can be effectively taken away from the charging connector 20 by the cooling medium.

Figure 13:
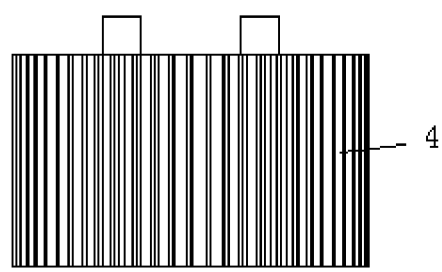
FIGS. 13-16 are schematic diagrams of a heat dissipator according to another embodiment of the present disclosure.
Figure 14:
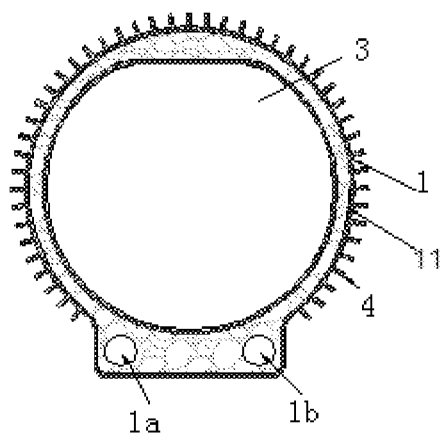
Figure 15:
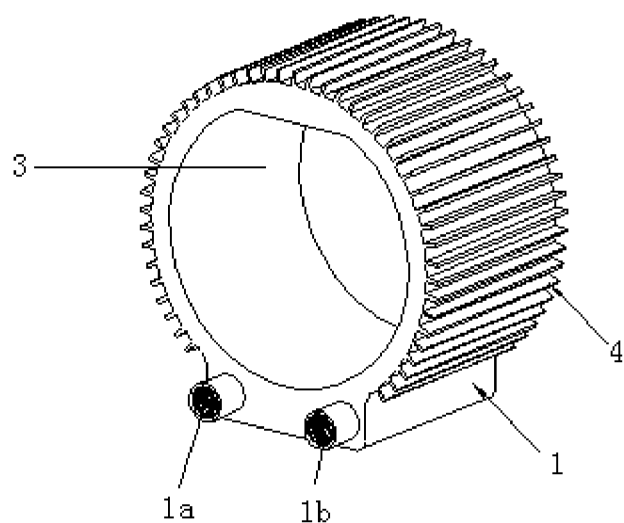

As shown in FIG. 13, the heat dissipator may further include the plurality of heat sinks 4. The plurality of heat sinks 4 is distributed on an outer surface and extends along an axial direction of the body 1, and the plurality of heat sinks 4 is circumferentially distributed on the body 1. In this way, the plurality of heat sinks 4 can be evenly distributed on the outer circumference of the body 1, to better take away the heat of the connecting terminal 21.

As shown in FIG. 12, the terminal sheaths 5 and the body 1 can be integrally molded. The integrally formed terminal sheaths 5 and body 1 are simple in structure, easy to manufacture, and low in cost.

According to an embodiment of the present disclosure, a cooling cavity is formed in the terminal sheath 5, where the cooling cavity is in communication with the cooling chamber 11, and the cooling cavity is located between the liquid inlet 1a and the liquid outlet 1b of the cooling chamber 11. That is to say, the cooling cavity in the terminal sheath 5 can participate in the circulation of the cooling medium in the cooling chamber 11, thereby directly and effectively reducing the temperature of the connecting terminal 21, and further ensuring the charging safety of vehicles.

A plurality of fixing holes is formed on the body 1, through which fixing members (such as bolts, and pins, etc.) can pass. Therefore, the heat dissipator 10 can be fixed with the charging connector 20, thus well ensuring the fixing reliability of the charging connector 20. Specifically, there are four fixing holes, and the connecting lines between the four fixing holes are quadrangular. The four fixing holes thus arranged allow the fixing connector 20 and the heat dissipator 10 to have a reasonable fixed position, and the force is evenly distributed at each fixed position, so that the fixing reliability between the charging connector 20 and the heat dissipator 10 can be better guaranteed.

According to an embodiment of the present disclosure, the body 1 and the terminal sheath 5 are made of an insulating material. The insulating material is non-conductive, which can prevent external leakage during the charging process, thereby ensuring the charging safety.

It should be noted that the above two embodiments are merely illustrative, and non-conflicting components therein can be combined with each other. For example, the air blower 7 in the heat dissipator 10 of the first embodiment can also be incorporated into the heat dissipator 10 of the second embodiment. For example, the terminal sheaths 5 in the heat dissipator 10 of the second embodiment can also be incorporated into the heat dissipator 10 of the first embodiment. For example, the pattern of arrangement of the liquid inlet 1a and the liquid outlet 1b in the heat dissipator 10 of the second embodiment can also be incorporated into the cooling chamber 11 of the heat dissipator 10 of the first embodiment.

The heat dissipation body 30 is further described below with reference to the drawings.

Figure 2:
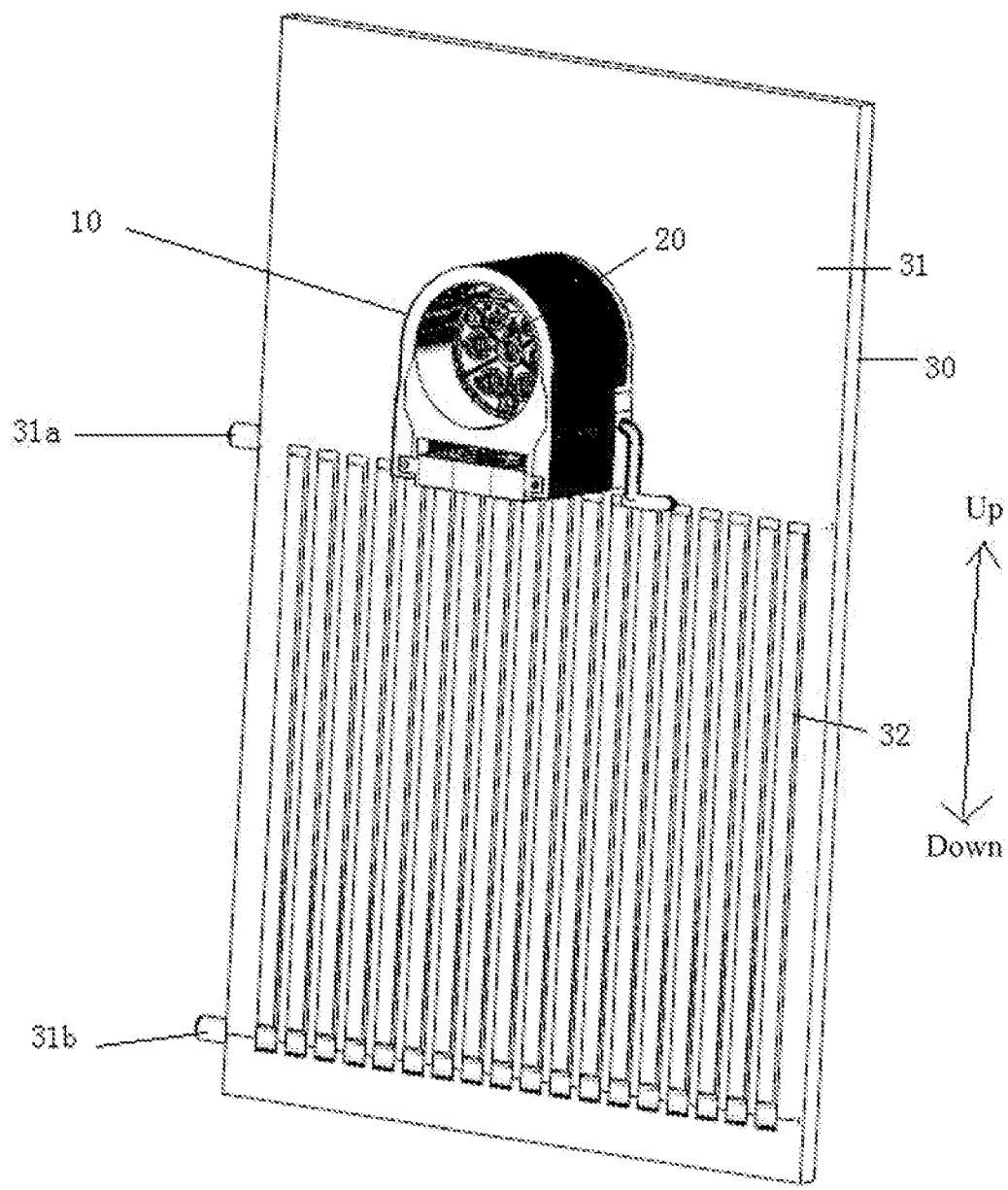
FIGS. 2 and 3 are respectively schematic diagrams of a heat dissipation device viewed at different angles according to an embodiment of the present disclosure.

As shown in FIGS. 2, 8 and 12, the heat dissipation body 30 includes cooling channels provided on the board 31. Specifically, the heat dissipation body 30 includes a plurality of second heat sinks 32 provided on the board 31, in which a cooling channel is formed in each of the second heat sinks 32, or in other words, the second heat sinks 32 are provided on the cooling channels. The cooling chamber 11 is in communication with the cooling channels of the second heat sinks 32. The arrangement of the second heat sinks 32 can effectively accelerate the heat dissipation efficiency of the heat dissipator 10, which can further facilitate the heat dissipation of the charging connector 20. In addition, the second heat sinks 32 thus arranged can meet the requirements of charge and discharge of liquids to or from the cooling chamber 11, thus ensuring the working reliability of the cooling chamber 11.

The heat dissipation device 100 for a vehicle according to the embodiments of the present disclosure can facilitate the heat dissipation of the charging connector 20 by properly arranging the heat dissipator 10 and the heat dissipation body 30, thereby ensuring the working reliability of the charging connector 20, and the charging safety of vehicles.

The cooling channels are provided around the cooling chamber 11. In this manner, the cooling channels have a better effect in cooling the heat dissipator 10 and the charging connector 20, and the flow of the coolant between the cooling channels and the cooling chamber 11 is smooth.

Figure 3:
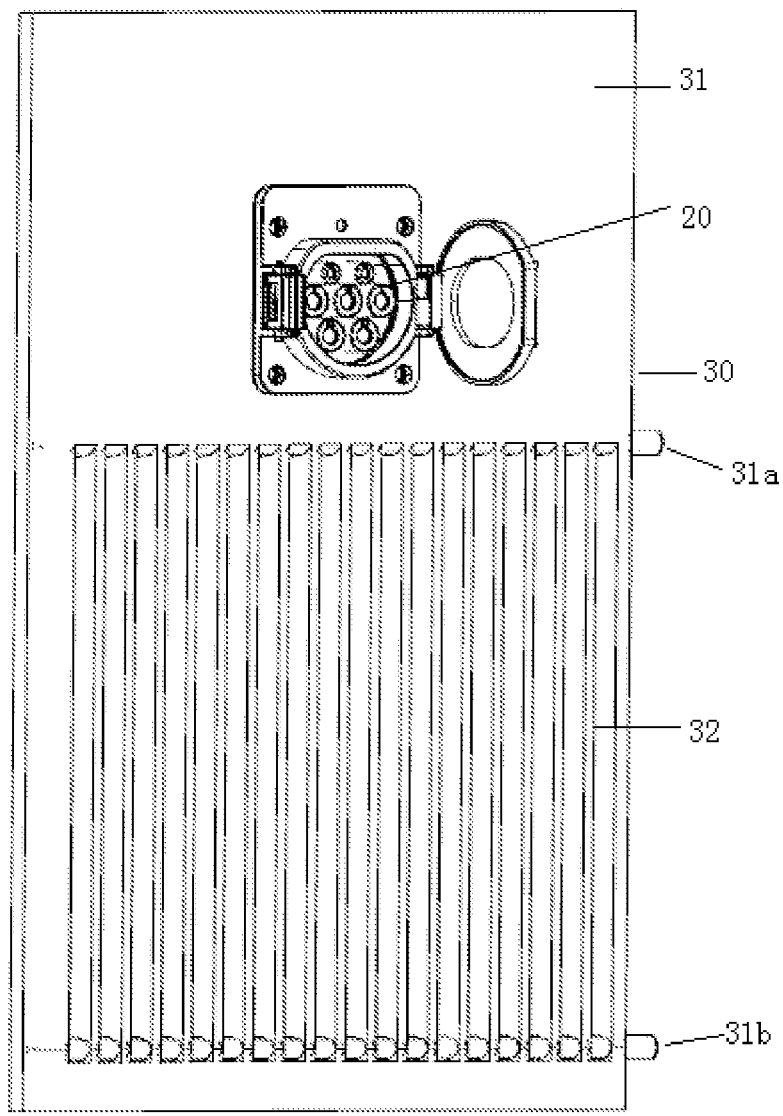
Figure 4:
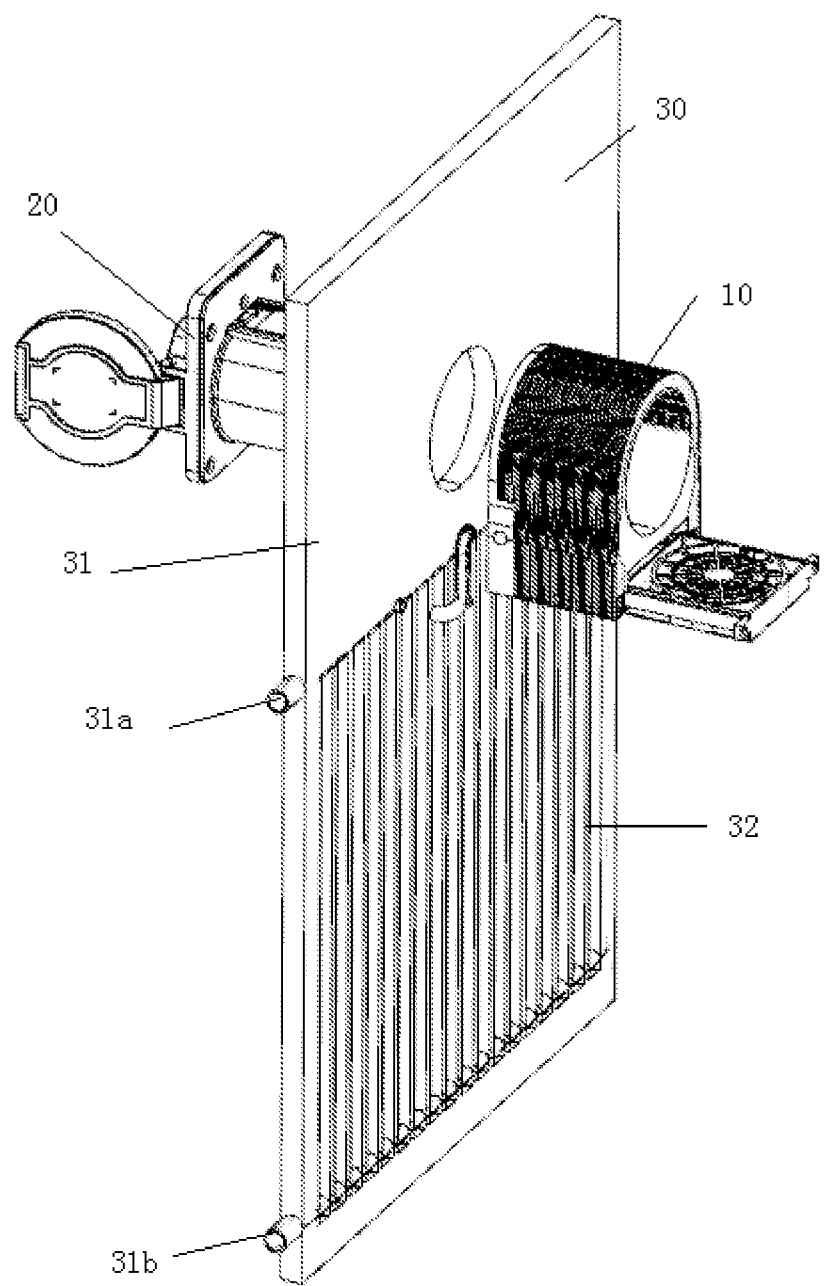
FIG. 4 is an exploded diagram of a heat dissipation device.

According to an embodiment of the present disclosure, as shown in FIGS. 2-4, a common inlet 31a and a common outlet 31b can be formed on the board 31, and the cooling channels of the plurality of second heat sinks 32 share the common inlet 31a and the common outlet 31b. In other words, the board 31 can be provided with one common inlet 31a and one common outlet 31b. This reduces the complexity of the board 31, and ensures the smoothness in charge and discharge of liquids to or from each of the second heat sinks 32.

According to an embodiment of the present disclosure, the common inlet 31a is located directly above the common outlet 31b. As such, the cooling medium is promoted to flow from top to bottom under the action of gravity, so that the cooling medium is facilitated to flow in the second heat sinks 32, thereby improving the overall operation reliability of the heat dissipation device 100. Alternatively, the common inlet 31a is located directly below the common outlet 31b, so that the coolant can flow out of the cooling channels only after the cooling channels are filled with the coolant, thereby improving the cooling effect of the heat dissipator 10.

The cooling chamber 11 is provided with an inlet and an outlet at two ends, in which the inlet is at least connected to the cooling channel of one of the second heat sinks 32, and the outlet is at least connected to the cooling channel of an additional second heat sink 32. In other words, the cooling chamber 11 can be connected between two of the second heat sinks 32, whereby the cooling chamber 11 can ensure its own charge and discharge of liquids, and can effectively exchange heat with the body 1 and the charging connector 20.

A vehicle according to an embodiment of the present disclosure includes: the heat dissipation device 100 in the foregoing embodiment and a cooling system 200, where the cooling channel and the cooling chamber 11 communicate with the cooling system 200, respectively, by means of serial or parallel connection. That is, the cooling chamber 11 and the cooling channel are connected in series to the cooling system 200. When the charging connector 20 charges a power battery, the cooling system 200 starts to work, and the cooling medium flows through the cooling channel and the cooling chamber 11 to take away the heat of the connecting terminal constantly, thus preventing the overheating of the connecting terminal and ensuring the charging safety of vehicles.

According to an embodiment of the present disclosure, as shown in FIG. 1, the cooling system 200 includes: a pump 210, a heat exchanger 220, and a liquid storage tank 230. A circulation loop is formed between the pump 210, the heat exchanger 220, the liquid storage tank 230, the cooling channel of the heat dissipation body 30, and the cooling chamber 11. Therefore, the pump 210 operates when the charging connector 20 is docked with the charging gun 610 on the charging post 600, to pump the cooling medium into the cooling channel and the cooling chamber 11, so that the heat of the connecting terminal is constantly taken away by the cooling medium in the cooling chamber 11. It should be noted that the heat of the connecting terminal is transmitted to the heat dissipator 10 through a shell of the charging connector 20, and then indirectly taken away by the air blower 7 and the cooling medium. The cooling system 200 further includes a filter 240 arranged between the pump 210 and the heat exchanger 220 and configured for filtration.

Figure 17:
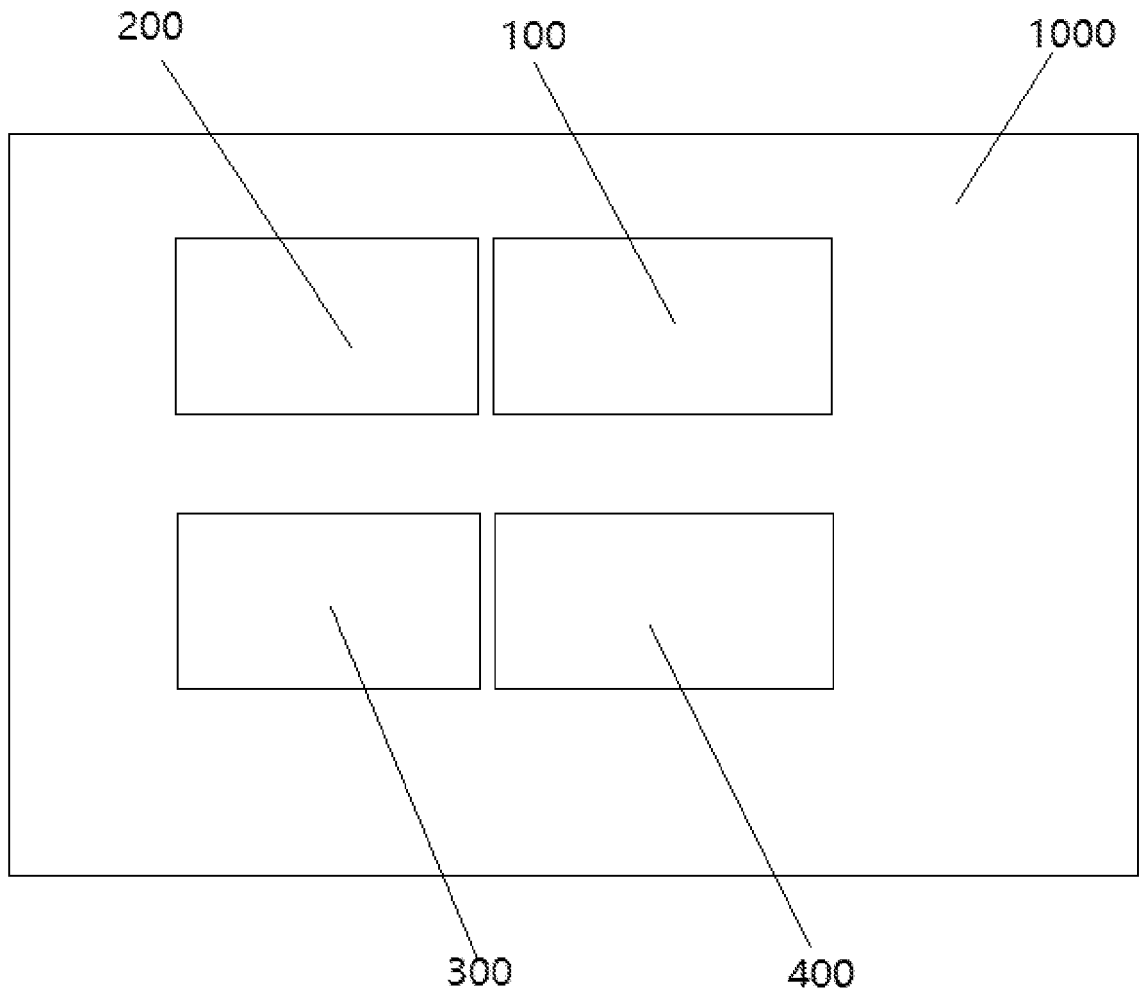
FIG. 17 is a schematic diagram of a vehicle according to an embodiment of the present disclosure.

According to an embodiment of the present disclosure, as shown in FIGS. 1, 2, and 17, the vehicle may further include: a plug-in detection member 300 and an electric control module 400. The plug-in detection member 300 is configured to detect the plug-in state of the charging gun 610 plugged in the charging connector 20. The electric control module 400 is electrically connected to the plug-in detection member 300 and controls the pump 210 and the air blower 7 to work after receiving a signal that the charging gun 610 is plugged in. As shown in FIG. 1, the charging connector 20 may further include a power distribution module 500 configured to distribute power to the electric control module 400, and the electric control module 400 controls the working state of the pump 210. Therefore, the charging connector 20 can achieve the purpose of reasonable control, and can ensure that the cooling medium flows in the cooling channel during charging.

The electric control module 400 can also control the working state of the air blower 7. It should be noted that the electric control module 400 can reasonably control the working state of the cooling system 200 and the air blower 7. For example, when the temperature at the charging connector 20 reaches a first predetermined temperature, the pump 210 of the cooling system 200 works, and when the temperature at the charging connector 20 reaches a second predetermined temperature, the air blower 7 works. The air blower 7 may have multiple air flow levels, and as the temperature rises, the level increases continuously.

In the description of the present specification, the description with reference to the terms "one embodiment", "some embodiments", "examples", "specific examples", or "some examples", etc. means that specific features, structures, materials, or characteristics described in connection with the embodiment or example are included in at least one embodiment or example of the present disclosure. In this specification, the schematic expressions of the above terms are not necessarily directed to the same embodiment or example. Moreover, the particular features, structures, materials, or characteristics described may be combined in any suitable manner in any one or more embodiments or examples. In addition, without contradiction, various embodiments or examples and features of various embodiments or examples described in this specification can be combined by those skilled in the art.

Although embodiments of the present disclosure have been shown and described above, it can be understood that the foregoing embodiments are exemplary and should not be construed as limiting the present disclosure. Changes, modifications, substitutions and variations can be made to the embodiments by those skilled in the art without departing from the scope of the present disclosure.

What is claimed is:

1. A heat dissipator for a charging connector, the heat dissipator comprising:
 a body,
 a cooling chamber formed in the body,
 an air blower mounted on the body and below the cooling chamber,
 a receiving hole disposed at an inner circumference of the body, a plurality of first heat sinks distributed on an outer surface of the body, wherein:

the receiving hole is configured to accommodate the charging connector; and an air vent is provided on the body, through which air flows from the air blower to the plurality of first heat sinks.

2. The heat dissipator for a charging connector according to claim 1, wherein the cooling chamber is arranged at a bottom of the body and spaced apart from the plurality of first heat sinks in a radial direction of the body.

3. The heat dissipator for a charging connector according to claim 1, wherein the plurality of first heat sinks extends along the inner circumference of the body and is spaced apart from each other in an axial direction of the body.

4. The heat dissipator for a charging connector according to claim 1, wherein the cooling chamber has a cold-air side wall facing the air blowing direction of the air blower, the cold-air side wall is spaced from the air blower, and the air vent is located between the cold-air side wall and the air blower.

5. The heat dissipator for a charging connector according to claim 4, wherein the body has an inverted U-shape and has two side walls that are connected at a predetermined height from g bottom end to form the receiving hole.

6. The heat dissipator for a charging connector according to claim 5, wherein the plurality of first heat sinks extend on the body to bottom gag of the two side walls, and are then curved and extend to bottom surfaces of the bottom ends.

7. The heat dissipator for a charging connector according to claim 6, wherein the outer surface of the body is of an inverted complete U shape; and on the outer surface of the body, some first heat sinks of the plurality of first heat sinks are of an inverted complete U shape, and other first heat sinks of the plurality of first heat sinks are of an inverted semi-U shape to avoid an inlet and an outlet on the cooling chamber.

8. The heat dissipator for a charging connector according to claim 5, wherein the air blower is provided at opposite bottom ends of the two side walls.

9. The heat dissipator for a charging connector according to claim 8, wherein the opposite bottom ends of the two side walls are respectively provided with a clamping slot, and lateral ends of the air blower are clamped in the clamping slots.

10. The heat dissipator for a charging connector according to claim 9, wherein the clamping slot is L-shaped, and comprises a long slot and a short slot, where the long slot extends in an axial direction of the body, and the short slot extends laterally at the bottom end of the side wall.

11. The heat dissipator for a charging connector according to claim 10, wherein a length of the long slot is less than an axial length of the side wall, and a length of the short slot is less than a thickness of the side wall.

12. A heat dissipation device for a vehicle, the heat dissipating device comprising:

a body;

a cooling chamber formed in the body;

a receiving hole disposed at an inner circumference of the body, wherein the receiving hole is configured to accommodate the charging connector;

a heat dissipation body comprising a board and cooling channels provided on the board, wherein the heat dissipator is fixed on the board, and the cooling chamber is in communication with the cooling channels; and a charging connector, accommodated in the receiving hole.

13. The heat dissipation device for a vehicle according to claim 12, wherein the cooling channels are provided around the cooling chamber.

14. The heat dissipation device for a vehicle according to claim 13, further comprising a plurality of second heat sinks, wherein the plurality of second heat sinks are provided on the cooling channels.

15. The heat dissipation device for a vehicle according to claim 14, wherein a common inlet and a common outlet are formed on the board, and the cooling channels of the plurality of second heat sinks share one common inlet and one common outlet.

16. A vehicle, comprising the heat dissipation device according to claim 12, and further comprising:

a cooling system, wherein the cooling channels and the cooling chamber communicate with the cooling system respectively, wherein the cooling system comprises a pump, a heat exchanger and a liquid storage tank, wherein a circulation loop is formed among the pump, the heat exchanger, the liquid storage tank, the cooling channel, and the cooling chamber, wherein the vehicle further comprises: a plug-in detection member and an electric control module, wherein the plug-in detection member is configured to detect a plug-in state of a charging gun plugged in the charging connector, and the electric control module is electrically connected to the plug-in detection member and controls the pump and the air blower to work after receiving a signal that the charging gun is plugged in.

* * * * *